(12) United States Patent
Liu et al.

(10) Patent No.: US 9,068,275 B2
(45) Date of Patent: Jun. 30, 2015

(54) COMPOSITE GEOMETRICAL DESIGN FOR A GRAIN STARTER IN A BRIDGMAN INVESTMENT CASTING PROCESS

(71) Applicant: GENERAL ELECTRIC COMPANY, Schenectady, NY (US)

(72) Inventors: Shan Liu, Central, SC (US); Warren Tan King, Greenville, SC (US); Srinivasan Raghavan, Bangalore (IN); Arthur S. Peck, Greenville, SC (US); Dayananda Narayana, Karnataka (IN)

(73) Assignee: General Electric Company, Schenectady, NY (US)

( * ) Notice: Subject to any disclaimer, the term of this patent is extended or adjusted under 35 U.S.C. 154(b) by 93 days.

(21) Appl. No.: 13/889,534

(22) Filed: May 8, 2013

(65) Prior Publication Data
US 2014/0332175 A1 Nov. 13, 2014

(51) Int. Cl.
*C30B 35/00* (2006.01)
*C30B 11/00* (2006.01)
(Continued)

(52) U.S. Cl.
CPC .................. *C30B 11/00* (2013.01); *C30B 35/00* (2013.01); *B22C 13/08* (2013.01); *B22C 7/02* (2013.01);
(Continued)

(58) Field of Classification Search
CPC .......... B22C 7/02; B22C 9/065; B22C 13/08; B22C 13/085; B22D 15/04; B22D 27/04
USPC ........ 164/122.1, 122.2, 412; 117/37, 63, 206, 117/219, 222, 223
See application file for complete search history.

(56) References Cited

U.S. PATENT DOCUMENTS 4,180,119 A * 12/1979 Burd et al. ...................... 164/34
4,548,255 A 10/1985 Reiner et al.
(Continued)

FOREIGN PATENT DOCUMENTS

CN 102166643 A 8/2011
EP 0105823 A1 4/1984
(Continued)

OTHER PUBLICATIONS

European Search Report and Written Opinion issued in connection with corresponding EP Application No. 14166335.1-1353 on Aug. 6, 2014.
(Continued)

*Primary Examiner* — Kevin P Kerns
*Assistant Examiner* — Steven Ha
(74) *Attorney, Agent, or Firm* — McNees Wallace & Nurick LLC

(57) ABSTRACT

A grain starter for use in solidification of molten metallic material forming an article having a directional grain structure and a method for solidifying an article having a directional grain structure with a substantial absence of stray grains. The grain starter comprises a grain-starting material that initiates grain growth in the molten metallic material in a preselected crystallographic direction. The grain-starting material has a melting temperature higher than the metallic material forming the article lest the grain starter be modified by contact with the molten material. The grain starter further includes a feature that modifies heat transfer characteristics of the metallic material in contact with it in order to produce an article having grains oriented in the preselected crystallographic orientation and modifies the profile of the advancing solidification front. The article is substantially free of stray grains not oriented in the preselected crystallographic direction.

20 Claims, 8 Drawing Sheets

(51) Int. Cl.
*C30B 11/14* (2006.01)
*C30B 29/52* (2006.01)
*B22C 7/02* (2006.01)
*B22C 9/06* (2006.01)
*B22C 13/08* (2006.01)
*B22D 15/04* (2006.01)
*B22D 27/04* (2006.01)

(52) U.S. Cl.
CPC .......... *B22C 9/065* (2013.01); *B22D 15/04* (2013.01); *B22C 13/085* (2013.01); *B22D 27/04* (2013.01); *C30B 11/006* (2013.01); *C30B 11/14* (2013.01); *C30B 29/52* (2013.01)

(56) References Cited

U.S. PATENT DOCUMENTS

| | | | |
|---|---|---|---|
| 4,612,969 A * | 9/1986 | Burd et al. | 164/122.2 |
| 5,869,146 A | 2/1999 | McCluskey et al. | |
| 5,891,527 A | 4/1999 | Turek et al. | |
| 5,891,528 A | 4/1999 | Turek et al. | |
| 5,985,205 A | 11/1999 | Atmur et al. | |
| 5,985,470 A | 11/1999 | Spitsburg et al. | |
| 6,129,954 A | 10/2000 | Spitsburg et al. | |
| 6,254,935 B1 | 7/2001 | Eaton et al. | |
| 6,296,909 B1 | 10/2001 | Spitsburg et al. | |
| 6,299,988 B1 | 10/2001 | Wang et al. | |
| 6,410,148 B1 | 6/2002 | Eaton, Jr. et al. | |
| 6,468,648 B1 | 10/2002 | McCluskey et al. | |
| 6,485,848 B1 | 11/2002 | Wang et al. | |
| 6,517,960 B1 | 2/2003 | Wang | |
| 6,630,200 B2 | 10/2003 | Wang et al. | |
| 6,733,908 B1 | 5/2004 | Lee et al. | |
| 6,759,151 B1 | 7/2004 | Lee | |
| 6,844,075 B1 | 1/2005 | Saak et al. | |
| 6,929,852 B2 | 8/2005 | Lane et al. | |
| 6,969,555 B2 | 11/2005 | Meschter et al. | |
| 7,001,679 B2 | 2/2006 | Campbell et al. | |

FOREIGN PATENT DOCUMENTS

| | | |
|---|---|---|
| EP | 1580306 A2 | 9/2005 |
| WO | 0051761 A1 | 9/2000 |

OTHER PUBLICATIONS

Yu et al., "Solidification modeling of single-crystal investment castings", AFS transactions, pp. 417-428, Dec. 31, 1990.

Yang et al., "Stray Grain Formation in the Seed Region of Single-Crystal Turbine Blades", vol. No. 57, Issue No. 5, pp. 40-44, May 1, 2005.

Tong-Min et al., "Structure simulation in unidirectionally solidified turbine blade by dendrite envelope tracking model (II): model validation and defects prediction", Transactions of Nonferrous Metals Society of China, vol. No. 16, Issue No. 4, pp. 753-759, Aug. 1, 2006.

* cited by examiner

COMPOSITE GEOMETRICAL DESIGN FOR A GRAIN STARTER IN A BRIDGMAN INVESTMENT CASTING PROCESS

FIELD OF THE INVENTION

The present invention is generally directed to the Bridgman method for investment casting, and more specifically to a grain starter for controlling the cooling rate of the advancing solidification interface.

BACKGROUND OF THE INVENTION

The Bridgman method is used to produce articles such as turbine buckets by investment casting. Articles produced using the Bridgman investment casting process are characterized by a directionally solidified single grain structure or directionally solidified columnar grains. Articles with such a directionally solidified grain structures are particularly suited for uses in which the principal stresses experienced by the article are parallel to the directionally solidified grain structure.

Investment casting involves replicating the article that is to be cast using wax patterns. The wax may be injected into a metal or plastic mold having a cavity that is in the shape of the article. The wax patterns also replicate the gating/riser/runner system that is used to feed molten metal to form the article. A ceramic shell is then built up around the wax pattern. The shell may be built up by dipping the wax patterns into a ceramic slurry or ceramic slurries multiple times. The ceramic slurry or slurries include binders/additives to assist in fixing the slurry to the wax patterns. Of course, the first applied ceramic layer or face coat is critical as it will determine the surface finish of the article when cast. Alumina/zircon ceramic particles usually are used to form the face layer to provide an improved surface finish.

The wax pattern is dipped in ceramic layer multiple times, for example, up to twelve layers, the ceramic being allowed to dry before application of additional ceramic slurry. As distance from the face coat increases, larger ceramic particles of different composition, for example silica, may be used in subsequently applied layers.

After the investment or shell build-up has been completed, the assembly is then dewaxed in an autoclave at an elevated temperature to remove the wax from the ceramic shell. Next, the mold is preheated to burn off any binders while the ceramic walls of the mold develop sufficient strength to withstand a casting operation. The shell molds are next inspected for cracks and pieces that may have separated, as such spalled shell pieces can lead to defects in the cast article.

Ceramic wrapping pads may be applied to predetermined locations to improve feeding of the metal. The mold is then preheated, usually 50-150° F. lower than the pouring temperature of the metal or alloy that will be poured to fill the mold. Metal or alloy may then be poured into the mold, which forms the article as the metal or alloy cools. The ceramic mold may then be removed after solidification is complete.

The Bridgman process is used with the investment casting process described above. The preheated ceramic mold is transferred to a mold chamber of a casting machine and secured to a chill plate. After vacuuming, the mold is raised into the hot chamber, which is heated electrically by induction coils, resistance wire or $MoSi_2$ rods. In the Bridgman process, the metal or alloy that will form the article is melted in an inert ceramic crucible, most commonly, a zirconia or alumina crucible. Turbine buckets are formed of, for example, nickel-base (Ni-base) superalloys. These Ni-base superalloys are superheated in the crucibles to temperatures 200-300° F. above the melting temperature of the alloy. When the melt temperature is stabilized, the molten metal is poured into the mold cavity. The mold, filled with molten alloy, and a chill plate, positioned below the hot chamber which supports the mold, is then slowly withdrawn from the hot chamber, which is maintained above the melting point of the metal. As the mold filled with molten metal or alloy is withdrawn into the cold chamber from the hot chamber, heat is withdrawn from the mold through a chill plate, causing directional growth of the metal crystals in the mold initiating at the chill plate, the directional solidification advancing into the molten metal. Heat is also dissipated through radiation from the mold surface so that the molten metal close to the mold freeze sooner than the molten metal inboard of the mold surface at a given mold height above the chill plate. The rate of withdrawal of the mold from the heated furnace chamber depends on the specific features of the article, but is usually a few inches per hour and may be varied in accordance with the geometric structure of the article being solidified. After solidification is complete, the shell and any cores that may have been inserted into the mold may be removed.

The Bridgman method successfully produces directionally solidified and single crystal articles having substantially regular cross sections with thin walls. Regular cross sections includes all cross sections in which heat is withdrawn from the advancing solidification front in a more or less uniform manner, producing articles with single crystal or directionally solidified columnar grains. However, in articles having a significant increase in cross section, the amount of heat that must be removed suddenly increases, which slows the advance of the solidification interface, causing the interface away from the side of the mold to lag even further behind that of the molten interface in proximity to the mold.

The alteration of heat flow attendant to a sudden increase in article cross section may result in undercooling of regions of molten metal in front of the advancing solidification front. The undercooling of the molten metal may nucleate stray grains that grow in a direction that is different from that of the desired directionally solidified grains. These stray grains in general form high angle grain boundaries substantially perpendicular to the desired columnar grains and to the principal stresses experienced by the article when placed into service for its intended use, such as a turbine blade installed in a turbine. The grain boundaries associated with these stray grains have been proven to be the source of crack initiation, adversely affecting the creep/fatigue life and leading to premature failure of a directionally solidified article in environments in which creep/fatigue properties of the article are important.

What is needed is an innovative grain starter design that modifies the advancing solidification front such that the probability of nucleating a stray grain is substantially reduced or eliminated, thereby inhibiting the formation of stray grains and the deleterious high-angle grain boundaries associated with such grains.

SUMMARY OF THE INVENTION

The present invention encompasses a grain starter for use in solidification of molten metallic material forming an article having a directional grain structure. The article may be further characterized by having a change in its contour. The grain starter initiates grain growth in the molten metallic material in a preselected crystallographic direction by including at least one geometrical feature that modifies heat transfer characteristics of the metallic material in contact with it in order to produce an article having grains oriented in a preselected crystallographic direction. The article produced is substantially free of stray grains not oriented in the preselected crystallographic direction, particularly at changes of contour of the article. The at least one geometric feature for modifying and obtaining the desired heat transfer characteristics is a feature solely of the grain starter, and not of the article or the mold. The structure and the at least one geometric feature for modifying the heat transfer characteristics of the system may be removed by separating the grain starter from the article after solidification of the article in the mold.

The invention further includes a method for forming an article having directionally solidified grains. While the article has grains solidified in a preselected crystallographic direction, the article is substantially free of stray grains. The method for forming the article comprises the steps of providing a mold and providing a grain starter, the grain starter including means for transferring heat away from the grain starter. The grain starter is attached to the mold. Molten metal is supplied to the mold and a heat source is provided to maintain the molten metal in the mold within a preselected temperature range as solidification occurs. The mold, filled with molten metal, is slowly withdrawn from the heat source through a ceramic baffle into a cold zone adjacent to the heat source. The grain starter initiates nucleation and growth of grains in the preselected crystallographic direction, which form an advancing solidification front within the molten metal as heat is removed from the molten metal through the mold and through the advancing solidified region as the mold is withdrawn from the hot zone into a cold zone. A Bridgman furnace utilizing the Bridgman process, such as described above, is one way of directionally solidifying such an article, although other methods may also be suitable. Although the process of the present invention may utilize a standard Bridgman furnace, unlike the standard Bridgman process, the present invention further provides the means for transferring heat away from the grain starter, which alters a profile of the advancing solidification front of the molten metal within the mold such as may occur in the standard Bridgman process since the path of heat removal is altered. The molten metal-containing mold then continues to be withdrawn slowly from the heat source as heat is withdrawn through the grain starter and the means for transferring heat away from the grain starter. The formed grains advance into the molten metal in the preselected crystallographic direction determined by the grain starter. The solidification process is characterized by the substantial absence of a nucleation and growth of stray grains in the molten metal in front of the advancing solidification front. The process is continued until the molten metal in the mold is completely solidified, the structure including the article and the attached grain starter, which may be subsequently removed.

The present invention includes a structure formed by the grain starter using the modified solidification method. A structure comprises a grain starter and an article attached to the grain starter. The grain starter comprises a grain-starting material, while the article is characterized by directionally solidified grains, the grains aligned in a preselected crystallographic direction. The article is further characterized by a substantial absence of stray grains oriented at angles to the preselected crystallographic direction. A means for transferring heat away from the grain starter is provided. The means for transferring heat away from the grain starter modifies heat flow from the grain starter. The means for transferring heat away from the grain starter is a geometric feature of the grain starter is not a feature of the article requiring removal from the article.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The present invention utilizes a grain starter to initiate solidification of an article, such as a turbine bucket, a shroud or a nozzle, having directionally solidified (DS) grains or single crystal (SC) when investment casting utilizing a process such as the Bridgman method. In addition to initiating solidification, the grain starter modifies the heat removal pathway so as to eliminate stray grains at sudden changes of contour as the solidification front advances into the molten metal. The modification of the heat flow path eliminates supercooling of molten metal ahead of the advancing solidification front, thereby removing the driving force for nucleation of stray grains that may grow at angles that deviate significantly from a preselected crystallographic direction, such as the <001> direction in nickel-base superalloy casting. The article formed using the grain starter of the present invention is substantially free of stray grains. As used herein, stray grains mean grains that nucleate at the edges and corners of a larger section of the article as it solidifies, such as may occur at changes of contour, and which may grow at angles that deviate significantly from a preselected crystallographic direction. "Substantially free of stray grains" means the absence of stray grains that disrupt the growth of columnar grains or a single crystal while creating grain boundaries that serve as defect-originating sites in the article. As used herein, attached to the mold includes a grain starter that is attached to the mold bottom or which forms "in-situ" as solidification occurs from the mold bottom. As used herein, the preselected crystallographic direction also includes a naturally selected crystallographic direction that results from the transfer of heat away from the advancing solidification front.

Figure 1:
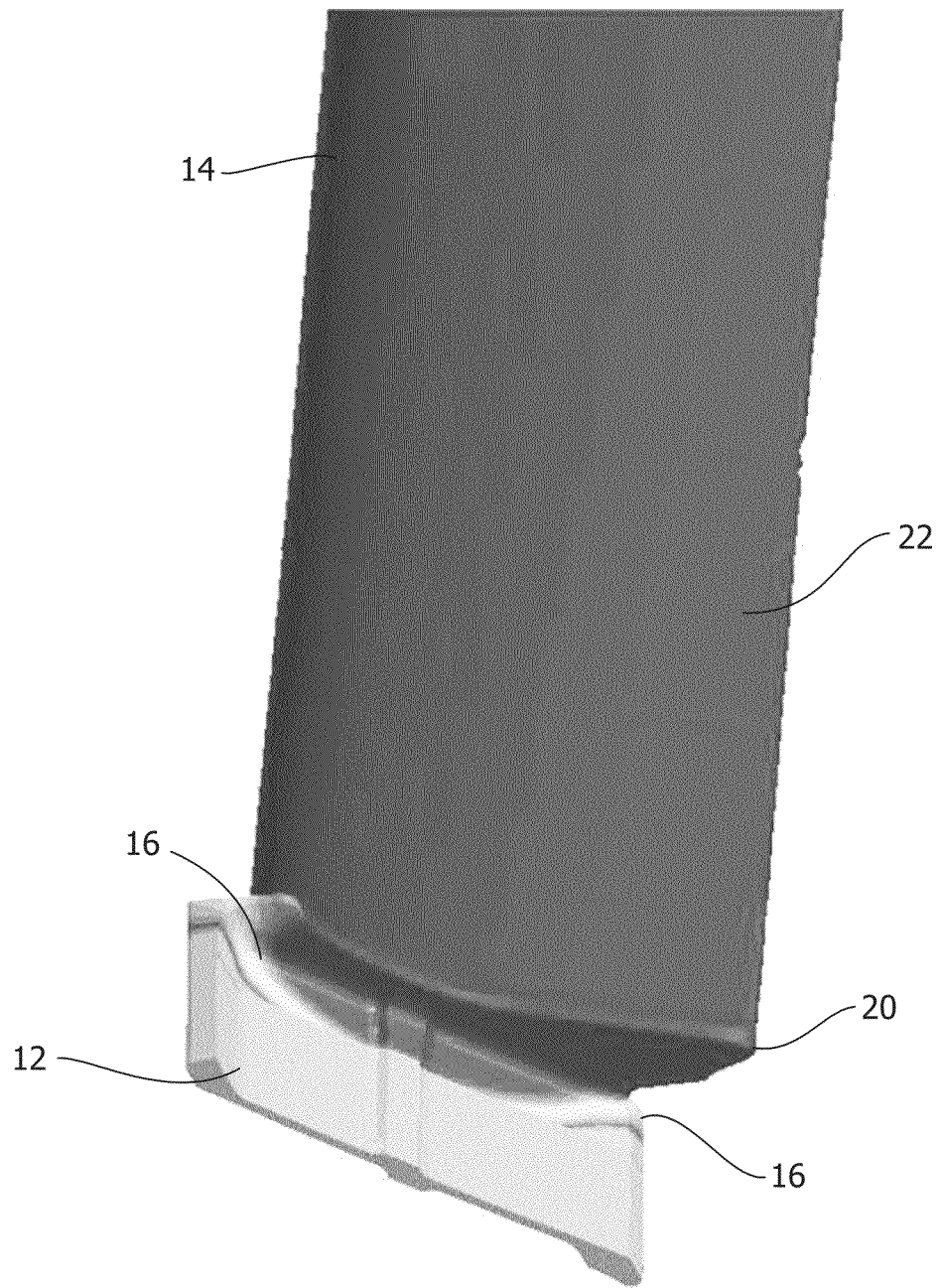
FIG. 1 illustrates the solidification front of a prior art grain starter.

FIG. 1 represents a typical solidification front from a prior art grain starter 12. In FIG. 1, the representation does not include the ceramic mold which normally surrounds the metal in the mold cavity, which is represented by region 14, the dark region located above grain starter 12 in what would be the airfoil region of a turbine bucket. Intermediate grain starter 12 and molten metal region 14 is the advancing solidification front 16. In FIG. 1, advancing solidification front 16 has a concave profile with respect to grain starter 12 as solidification front 16 advances into molten metal region 14 in airfoil portion 22 of the bucket.

Figure 8:
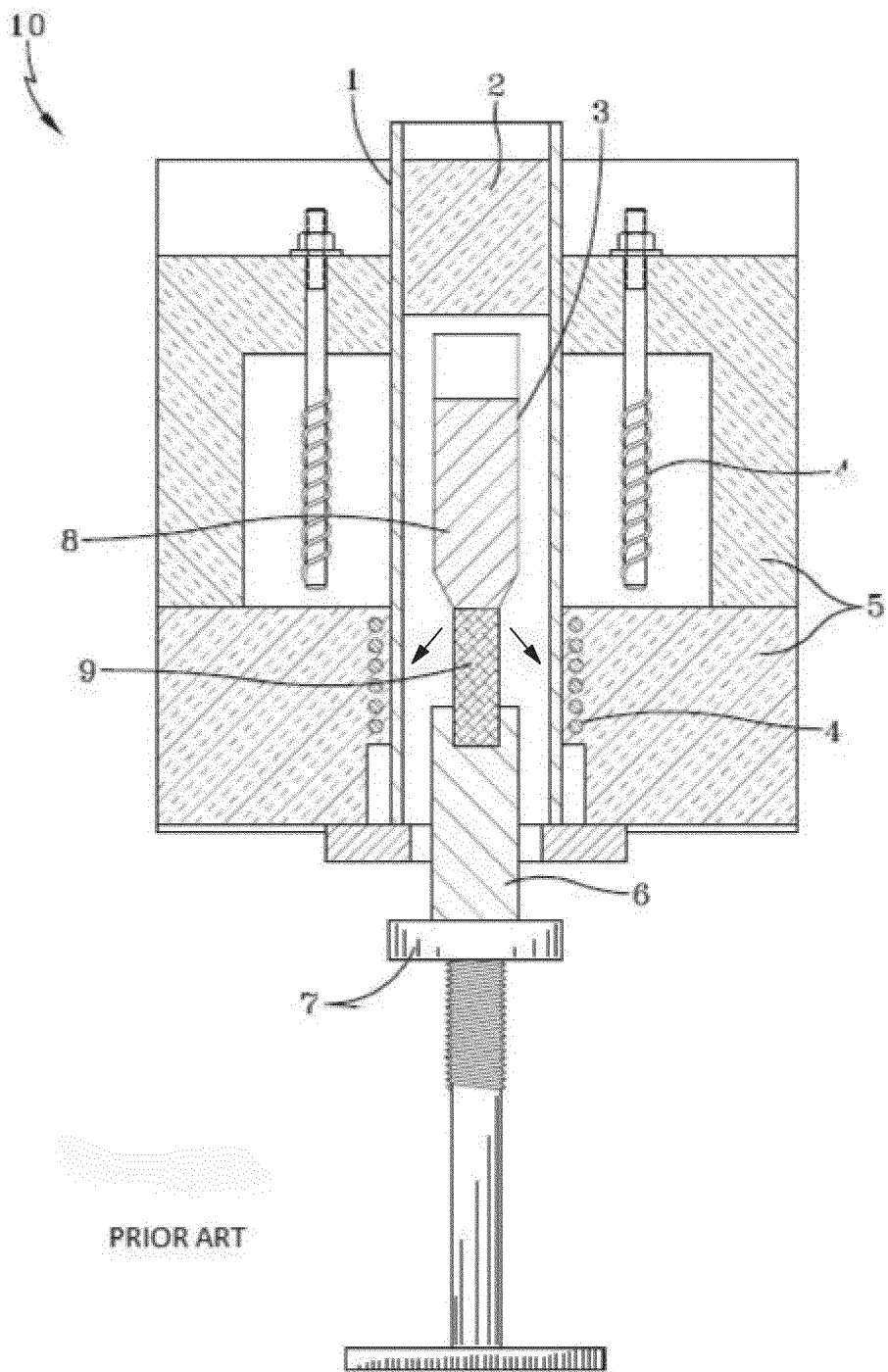
FIG. 8 is a generic representation of the vertical Bridgman Method showing an article partially withdrawn from molten metal maintained in the furnace portion of a Bridgman Furnace.

FIG. 8 depicts a typical Bridgman furnace arrangement where a generic grain starter 6 is slowly withdrawn from the furnace. The generic article 9 is withdrawn from molten metal 8 in the furnace. Heat is conducted away from the article 9 and from the advancing solidification front, not shown, vertically downwards to chill 7 by conduction and laterally through the mold surface and sides of grain starter by radiation. The direction of resultant heat flow from the advancing interface is in a direction depicted by the arrows due the air surrounding article 9. This results in a temperature profile of the article at the interface with the molten metal (i.e. advancing solidification interface) being lowest at the interface of the article/mold in the cold section and highest at the center of the article.

Referring back to FIG. 1, grain starter 12 has the shape shown. As in FIG. 8, the temperature profile of the advancing interface has is lowest temperature at the interface of the article/mold in the cold section and the highest temperature at the center. Thus, during a period of time that the advancing solidification front 16 is progressing into the molten metal 14 in the mold, it has a concave shape with respect to grain starter 12 as the mold is withdrawn into the cold zone of the furnace. At the interface between bucket tip shroud 20 and airfoil portion 22 of bucket 24, the drastic change in cross-section further aggravates the heat removal across advancing solidification from 16. The edges of the bucket tip shroud may be significantly cooler than molten metal ahead of the advancing solidification front so that the advancing solidification front and the related isotherms become even more concave. As a result, the distal corners having increased mass, such as tip shroud 20 in FIG. 1 could be undercooled such that heterogeneous nucleation of grains may occur, and such grain nuclei may grow quickly inward to interfere with the columnar grains growing from below. The resulting grain boundary from such a stray grain or grains is substantially perpendicular to the direction of bucket airfoil length. Furthermore, multiple nucleation events at a larger section, such as bucket tip shroud 20 may form higher angled grain boundaries. The change in contour in the Z-notch further contributes to the removal of heat locally at the contour, causing additional significant temperature differences due to additional heat removal at the contour change and further increasing the likelihood of nucleation and growth of stray grains.

Figure 2:
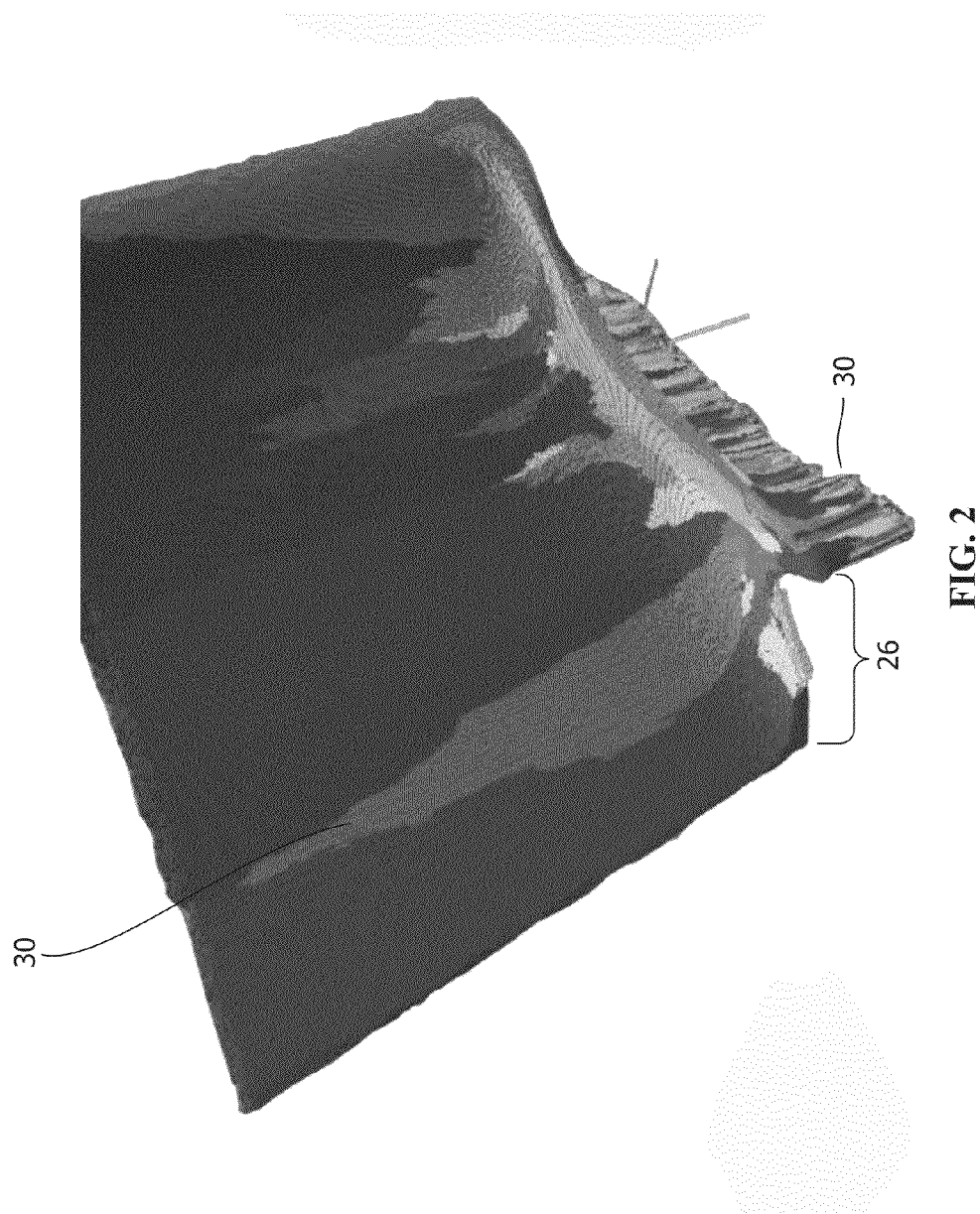
FIG. 2 depicts the predicted grain structure resulting the solidification front of FIG. 1 formed by the prior art grain starter.

FIG. 2 depicts the predicted grain structure resulting from the solidification front of FIG. 1 formed by the prior art grain starter 12. As can be seen, most of the directional grains 30 that form at grain starter 12 away from the edges continue into airfoil portion 22 of bucket 24. However, in the Z-notch 26 of bucket tip shroud 20, stray grains form that deviate from the <001> direction of the directionally solidified (DS) grains due to heterogeneous nucleation of grains in this cooler region.

Figure 3:
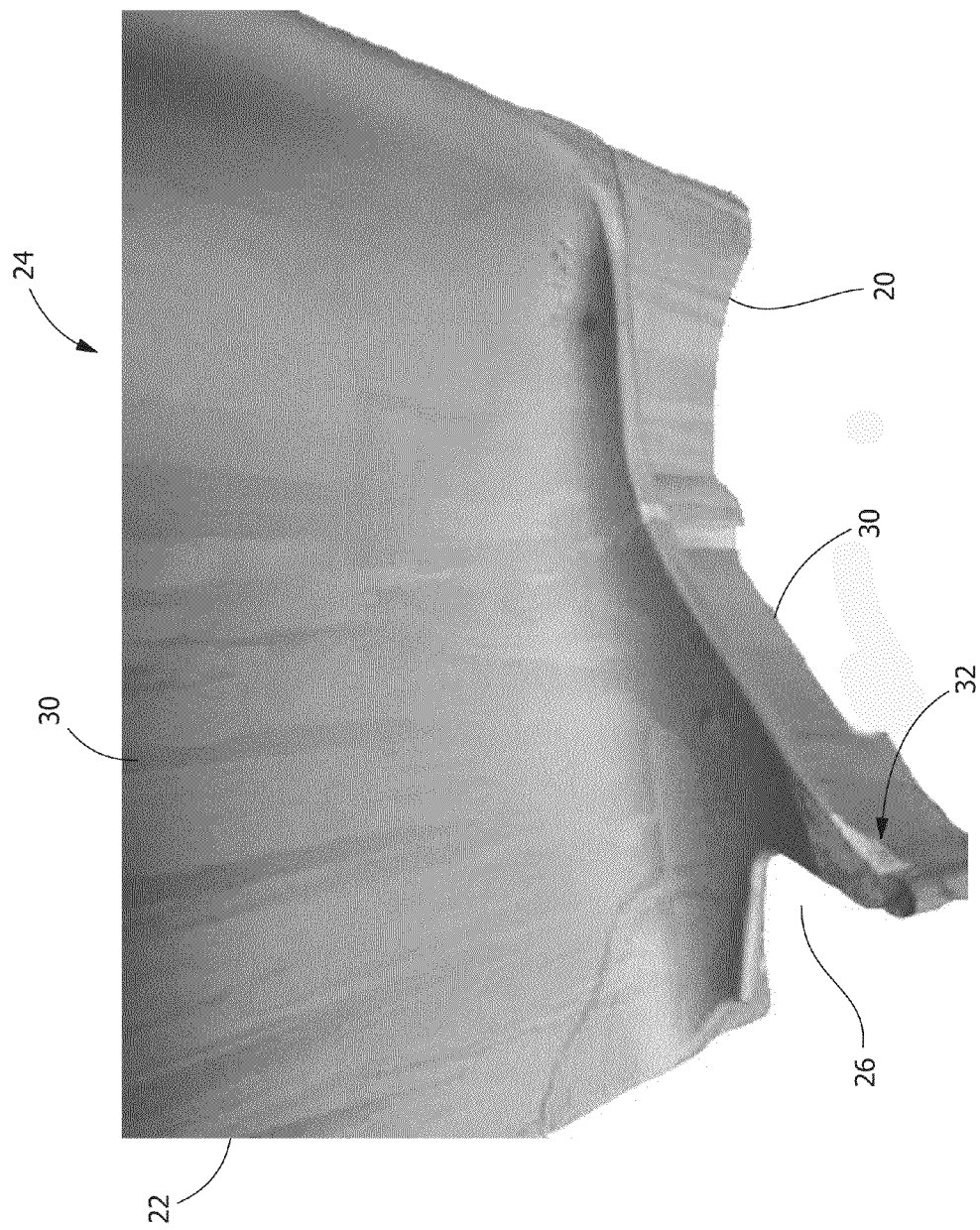
FIG. 3 shows a cast turbine bucket tip shroud grain structure (etched) formed with the prior art grain starter at the critical Z-notch location.
Figure 4:
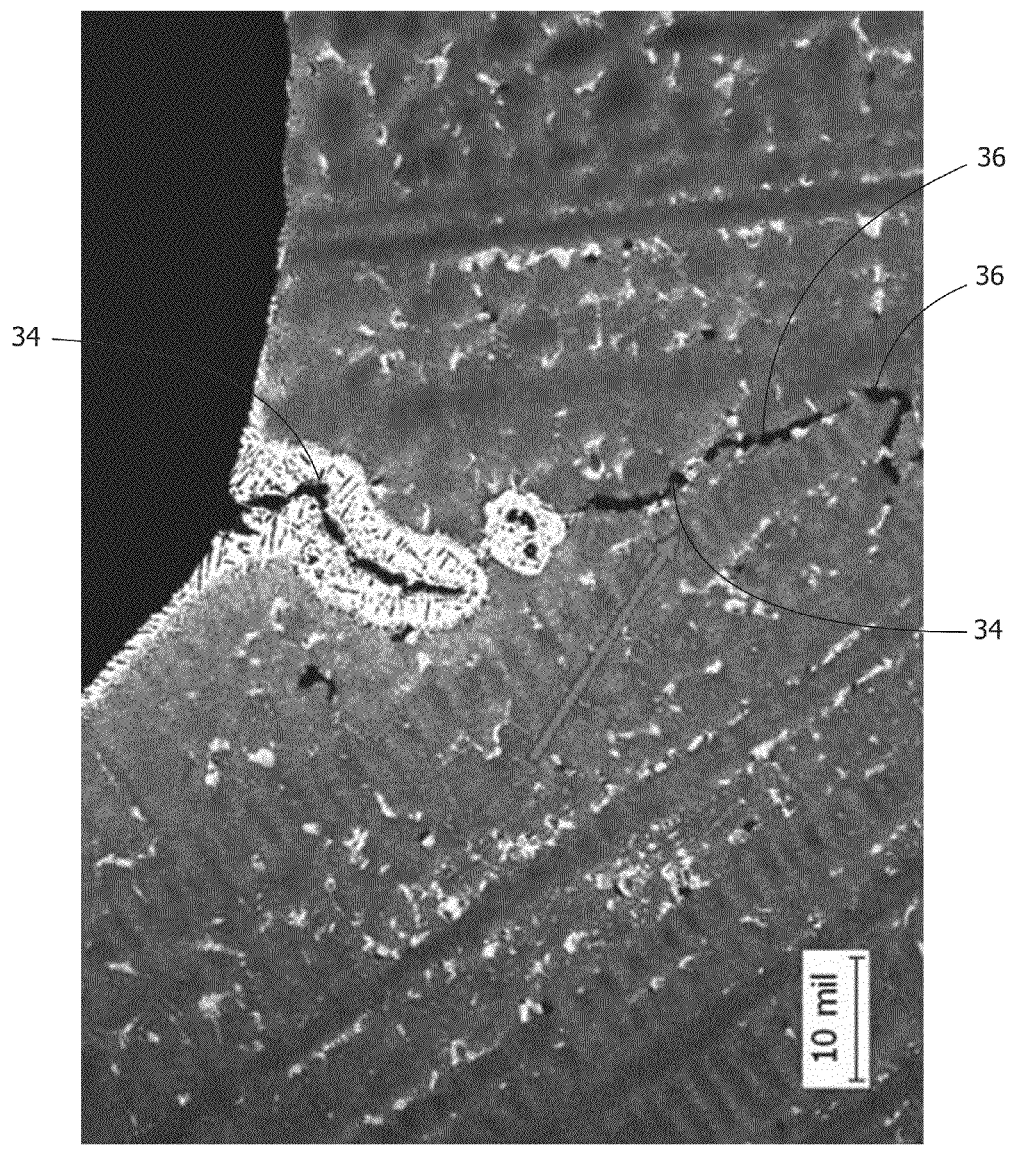
FIG. 4 is a section through a cast turbine bucket tip removed from service at the critical Z-notch showing grain boundary cracking initiating at the critical Z-notch and propagating along with the linkage of creep voids along the grain boundary.

The formation of stray grains is more evident in FIG. 3, which shows a cast turbine bucket grain structure near the bucket tip shroud 20 and at the Z-notch 26 region (etched) formed with the prior art grain starter 12. The formation of at least one stray grain 32 has grown to noticeable size. Stray grains 32 such as shown in FIG. 3 forming in Z-notch 26 region are deleterious and represent a weak region of bucket 24 since that region experiences high centrifugal force and high temperatures during turbine operation. DS grains are formed in the direction that is subject to the highest stresses, because DS grains are capable of handling these high stresses experienced during normal turbine operation. However, the stray grains formed at an angle to the DS grains are less able to withstand these stresses. As a result, failures tend to initiate at the Z-notch, as shown in FIG. 4, which is a section through an actual cast turbine bucket tip removed from service. As can be seen from FIG. 4, a grain boundary crack 34 has initiated in the critical Z-notch region and has propagated into bucket 24 by linkage of creep voids which form along high energy grain boundaries. The initiation of these cracks and their propagation by linking of creep voids causing premature cracking is a major distress mode in turbine buckets.

High angle grain boundaries due to growth of stray grains also increase the difficulty in post-cast processing of a turbine bucket 24, which may result in fracturing in the Z-notch region of the bucket and subsequent scrapping of the bucket.

Figure 5:
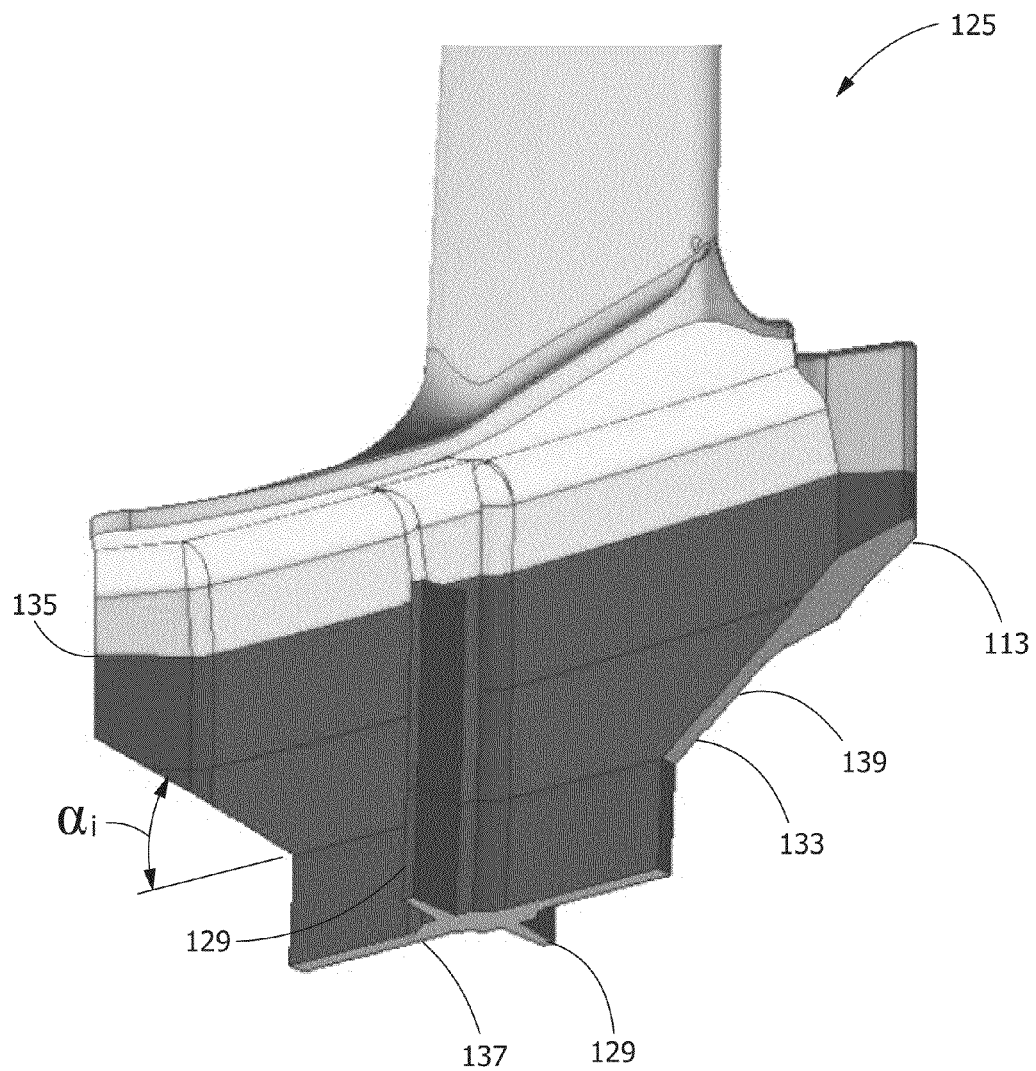
FIG. 5 depicts a grain starter design according to the present invention.

The present invention provides a new design for the grain starter so as to remove the conditions that are conducive to the formation of stray grains. Referring now to FIG. 5, a grain starter 113 in accordance with the present invention is depicted. Grain starter 113 includes at least one geometric feature attached to or integral with grain starter 113. In a preferred embodiment, the geometric feature is a plurality of fins 129 attached to grain starter 113. FIG. 5 further depicts another geometric feature of grain starter 113. In this Figure, grain starter 113 has a geometry in which it has a cross sectional area at a grain starter/article interface 135 that is greater than the cross sectional area opposite the grain starter/article interface at its base 137. The shape of the grain starter is defined by the arcuate transition connecting the grain starter/article interface to the opposite cross sectional interface. In FIG. 5, this shape provides an embodiment that is a trapezoidal pedestal 133, although the shape as described above is not so restricted. Trapezoidal pedestal 133 has the same cross-sectional shape as the article at grain starter/article interface 135 but has a narrow base 137, and an angled section 139 intermediate narrow base 137 and grain starter/article interface 135 connecting these features. Base 137 is "narrow" as compared to the base found on a prior art grain starter 12. Trapezoidal pedestal 133 modifies the heat removal from the solidifying article by virtue of its shape, allowing less heat removal along its edges while more heat is conducted through base 137 by the chill plate (not shown). The shape of trapezoidal pedestal 133 provides a different heat removal profile as compared to prior grain starter. It will further be understood that the shape, size, number and location of a geometric feature such as fin 129 and the shape of trapezoidal pedestal 133 will vary dependent upon the geometry of the actual part, as long as these geometric features modify the transfer of heat through grain starter so that the temperature in front of advancing solidification front 16 is not conducive to nucleation of stray grains. For a turbine bucket such as shown in the Figures, "narrow" base 137 may have a height of about 1 inch, acting as a major barrier for eliminating most grains that deviate from the desired orientation which guaranteeing that grains entering into the trapezoidal pedestal 133 have an orientation very close to <001> crystallographic direction.

The shape of trapezoidal pedestal 133 below the grain starter/article interface is critical to heat removal. Since the ceramic mold material in contact with the trapezoidal faces has a much small thermal conductivity that the solid metal, the trapezoidal pedestal design significantly modifies the axial heat flow from below the intermediate angled section 139 of the trapezoidal pedestal toward the chill plate in comparison with a simple rectangular shape of the prior art grain starter 12. More importantly, the gradual change in the cross-section of trapezoid naturally causes growth of grains above the region projected by a slanted face. Once the solidification interface advances from base 139 into intermediate angled section 139, the grains nucleated at the corners may spread their side arms laterally to occupy the gradually expanding lateral space of trapezoid. This natural action of lateral spreading growth ensures that there is a single grain in the wedge-projected area, for example, in region close to the Z-notch region of bucket tip shroud 20.

The actual design of the trapezoidal pedestal 133 results in it touching molten metal in the investment case mold; therefore its shape depends on the local geometry of a cast article. Base 137 is connected to grain starter/article interface 135 by intermediate angled section 139. The angle ($á_i$) of intermediate angled section 139 is closely related to the lateral dimension, $\Delta X$, to the height (H) of trapezoidal pedestal 133, and possibly with the manufacturing process as well. It is suggested that the height of the trapezoidal pedestal shall be 1~2" for a turbine bucket 24 as shown in the Figures. With all the reference information, the maximum length of base 137 shall be smaller than the top base of the trapezoid by ~$2\Delta X$.

The grain starter may be pre-machined or grown in-situ. In either form, the grain starter initiates nucleation/grain growth in the molten metallic material in the preselected crystallographic direction. When the grain starter is pre-machined, it is pre-machined so that nucleation and growth of grains occurs in the preselected crystallographic direction or orientation, such as <001> direction for nickel-base superalloys. The grain starter material is selected so that it has a melting temperature slightly higher than that of the metallic material comprising the article, lest the grain starter be modified by contact with the starting material. The grain starter could also be provided as an in-situ grown grain starter that serves to initiate the formation of grains very close to the preselected crystallographic direction. The article, on completion of solidification, is characterized by directionally solidified columnar grains. The directionally solidified grains align naturally in the preselected crystallographic direction. The article is further characterized by a substantial freedom from stray grains oriented at angles to the preselected crystallographic direction.

Figure 6:
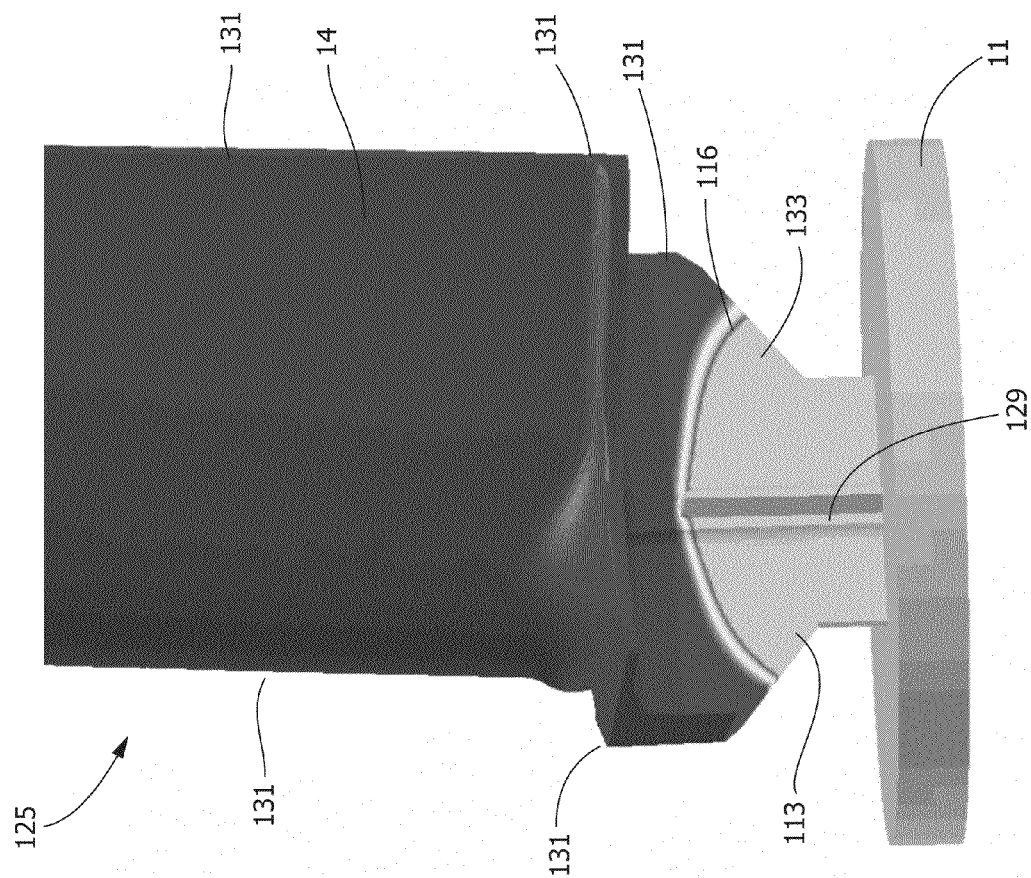
FIG. 6 illustrates the solidification front of the grain starter of the present invention.

In a preferred embodiment, the geometric feature represented by a plurality of fins 129 attached to grain starter 113 is a very important feature for controlling heat flow. This geometric feature is attached to grain starter 113 to improve heat transfer near the middle of bucket 24. The fins enhance heat transfer through the mid-point between the edges of grain starter 113 while decreases heat transfer near the edges due to the shape of trapezoidal pedestal 133, providing a more uniform temperature distribution in the molten metal in front of the advancing solidification front 16. Trapezoidal pedestal 133 with fins 129 can modify the solidification interface shape so that it is convex, as shown in FIG. 6. Fin 129 or a plurality of fins 129 may be attached to grain starter 113 or it may be formed integrally as part of grain starter 113. Regardless of the arrangement of the geometric features with respect to the grain starter, the function of this geometric feature is to alter the path of heat flow through grain starter 113, the geometric feature improving heat transfer near where it is located, while also changing the advancing solidification front in the molten metal during solidification.

For bucket 125 of FIG. 5, the plurality of fins 129, in FIG. 5 two fins 129, are symmetrically attached to the middle of grain starter 113 where the advancing solidification front is determined to be most lagging without the inclusion of such geometric features. The determination of where the advancing solidification front 16 is lagging may be made analytically, such as by use of computer programs, by actual temperature measurements or empirically by observation of grain patterns on as cast articles. Fins 129 are in heat transfer contact with both a chill plate 11, FIG. 6, and grain starter 113 to improve the conduction of heat away from advancing solidification front 16 where advancing solidification front 16 is lagging in the absence of a geometric feature such as fins 129. In a preferred embodiment, fins 129 are applied symmetrically to avoid any tilt or adverse reorientation of advancing solidification front 16.

Fin 129 preferably is no longer than the full height of grain starter 113 so that no extra post-cast material removal is needed. Preferably, fin thickness shall be no more than 60% of the local thickness of trapezoidal pedestal 133 and fin length shall be at least twice the fin thickness, where fin height refers to the dimension of the fin extending in a substantially vertical direction substantially perpendicular to chill plate 11, fin length refers to the dimension of the fin extending away from trapezoidal pedestal 133 and fin thickness refers to the width of the fin along its height, the thickness at any point along its height being parallel of chill plate 11. Such a fin design may at least improve cooling by a factor of at least 4.0. Preferably, the fin dimensions (height, length and width) are selected for a particular casting/grain starter design to provide an improvement in local transfer by a factor of at least 10.0.

Referring now to FIG. 6, the calculated advancing solidification front 116 above grain starter 113 of the present invention is shown. Grain starter 113 includes a pair of fins 129 and the grain starter is attached to a chill plate 11. Advancing solidification front 116 moves into molten metal 14 as solidification progresses. A comparison of advancing solidification front 116 with advancing solidification front 16 of FIG. 1 indicates that advancing solidification front 116 of FIG. 6 has a distinctly different profile than advancing solidification front 16 depicted in FIG. 1. The profile of solidification front 116 is convex with respect to grain starter 113 as the mold is withdrawn into the cold zone of the furnace, as contrasted to solidification front 16 of FIG. 1 which is concave with respect to prior art grain starter 12 as the mold is withdrawn into the cold zone of the furnace. This is attributable to fin 129 in grain starter 113 as well as to the trapezoidal shape of pedestal 133. Fin 129 is a heat sink that allows heat to be transferred from advancing solidification front 116 into fin 129 where heat can be removed by conduction more efficiently. Since the profile of the advancing solidification front has changed and the solidification front toward the center of bucket 125 is ahead of the solidification front along edges 131 of the bucket 125, there is no driving force for nucleation of stray grains along edges and at corners (such as the z-notch), so that the columnar grains continue to grow directionally to the edges and corners of tip shroud 20. This heat transfer mechanism is maintained along with the directional growth even as the solidification front advances through Z-notch 26. This is important because more metal mass is present in bucket tip shroud region 20, which means more molten metal requires a path for heat removal, which is provided by fins 129.

As advancing solidification front 116 moves further into airfoil portion 22, fin 129 has a reduced effect on advancing solidification front 116, and its shape may change. This is for several reasons. In airfoil portion 22 of bucket 125, the cross-section of bucket 125 is reduced since the airfoil portion is thinner. The thin cross-section has less metal mass and more area exposed to the cold zone of the furnace as the mold moves into the cold zone. In addition, as advancing solidification zone moves further away from bucket tip shroud 20 and fins 129, heat removal through fins 129 becomes less effective as heat transfer now preferentially occurs fairly rapidly from the large surface area of airfoil portion 22 to surrounding cold zone, and grains readily grow directionally into this region as advancing solidification front 116 moves rapidly into airfoil portion 22.

Figure 7:
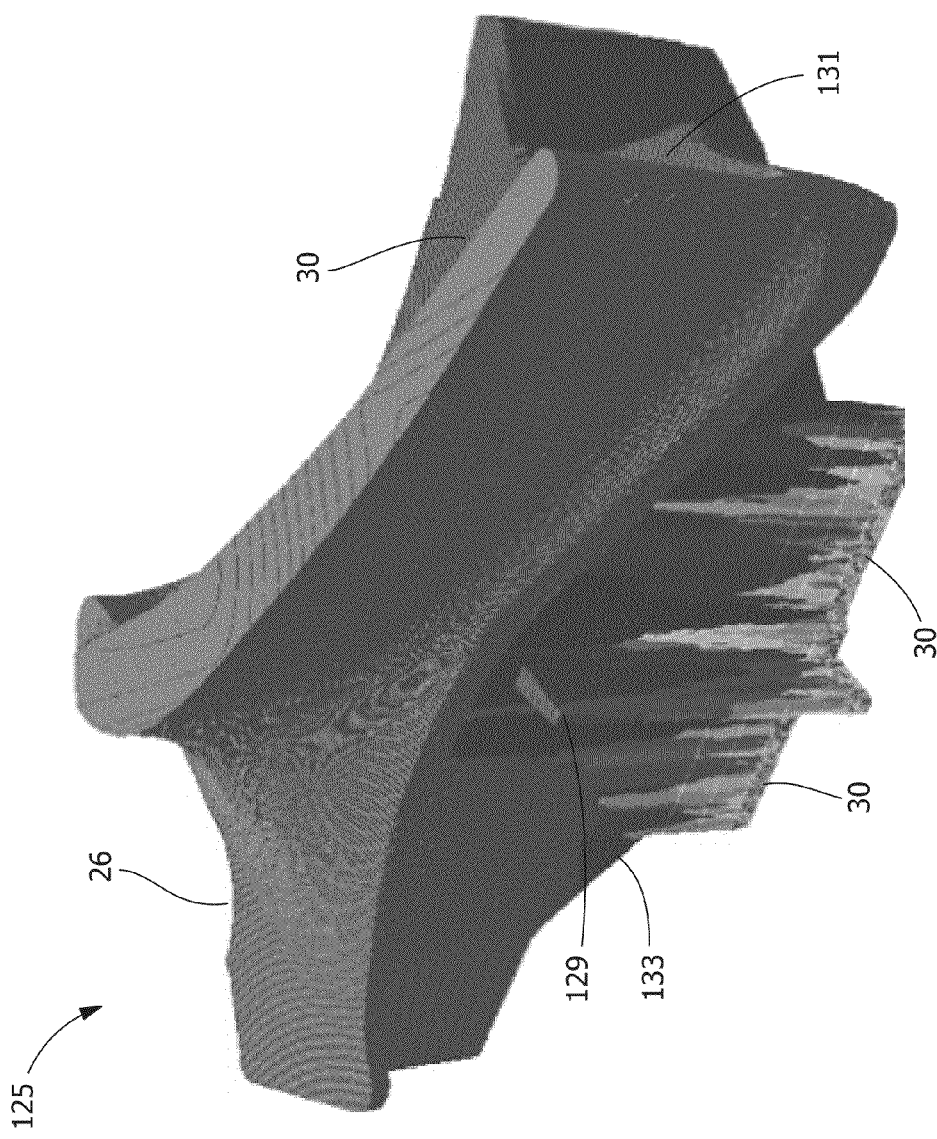
FIG. 7 depicts the predicted grain structure of the turbine bucket formed with the grain starter of FIG. 5 at the critical Z-notch area.

FIG. 7 depicts the predicted grain structure of turbine bucket 125 formed with grain starter 113 of FIG. 5 including the critical Z-notch region 26 of tip shroud 20. In this Figure, the nearly uniform dark grey color indicates that crystallographic growth occurs substantially in the preselected direction. Since the advancing solidification front 116 maintains a convex shape as it advances through Z-notch region 26, the probability of stray grains nucleating and growing toward edges 131 is substantially eliminated. In the absence of stray grains impeding the progress of advancing solidification front 116, directional grains initiated by grain starter 113 formed behind advancing solidification front 116 continue to progress into molten metal in the direction in which they were initiated, in this example in the <001> direction. Importantly, in the critical Z-notch region, a single columnar grain is present. The presence of the columnar grain in this Z-notch region is believed to be due to the effect of the shape of the trapezoidal pedestal 133, which facilitates the growth of only a single columnar grain in this region. This results in the elimination of the nucleation and growth of stray grains at this location that have been the source of cracks in buckets leading to failures.

Grain starter 113 of the present invention includes means for controlling heat flow from the advancing solidification front as it progresses into molten metal. Controlling the heat flow prevents the nucleation of stray grains oriented at angles divergent from the preselected direction initiated by grain starter 113. In the example provided above, this preferred direction is the <001> direction for the turbine bucket shown in FIGS. 1-7, although the direction may be modified as desired by machining grain starter 113 with a pre-selected orientation so the grains are initiated and grow, for example in the <111> direction or the <110> direction. Controlling heat flow in particular prevents the formation of stray grains at changes in contour of turbine bucket 125, which may occur at Z-notch region 26 in the absence of such control. In turbine bucket 125, Z-notch region 26 includes changes in contour where heat can be drawn off rapidly. In Z-notch region 26, turbine bucket 125 also experiences a significant change in cross-sectional area.

Fins 129 are added to grain starter 113 to modify the heat transfer characteristics of the mold as advancing solidification front 116 progresses into the molten metal to control the directional solidification. Grain starter 113 itself, either pre-machined having the pre-selected orientation or formed in-situ on the chill plate, is provided to initiate grain growth in a preselected crystallographic direction. Grain starter 113 forms no part of turbine bucket 125 and is removed from turbine bucket 125 after solidification of the bucket. Fins 129 also are removed from turbine bucket 125 as they are part of grain starter.

Grain starter, when pre-machined, may be any metallic material that can impart directional solidification to molten metal while having a melting temperature higher than that of the alloy used to form the article that is to be directionally solidified. While turbine buckets are described herein as the product formed using grain starter 113 that may alter the solidification process so as to produce a directionally solidified grain structure free of stray grains, any article requiring a directionally oriented crystallographic grain structure that experiences defects in specific regions due to the nucleation and growth of stray grains, particularly where there is a change in contour, may be solidified using a grain starter of the present invention in order to eliminate the formation of stray grains. While turbine buckets are typically formed of high temperature nickel-base superalloys, the present invention may be used to form directionally solidified articles of, for example, cobalt-base superalloys, iron-base superalloys, combinations of iron-cobalt-nickel base superalloys, nickel-base alloys, steels, including stainless steels and tool steels, titanium and its alloys among other available metallic materials that are used for producing cast articles, preferably having a directionally solidified grain structure.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A grain starter for solidification of molten metallic material forming an article having a directional grain structure, comprising:
   a metallic grain starter that initiates grain growth in the molten metallic material in a preselected crystallographic direction at an interface between the grain starter and the molten metallic material;
   the metallic grain starter including at least one geometric feature extending from the grain starter that modifies heat transfer characteristics of the solidifying metallic material in contact with it so as to maintain the grain growth in the preselected crystallographic direction at contour changes of the article; and
   wherein the modification of the heat transfer characteristics by the grain starter and the geometric feature extending away from the grain starter eliminates stray grains at the contour to produce an article having grains oriented in the preselected crystallographic direction.

2. The grain starter of claim 1 wherein the grain starter is a pre-machined metallic material having a melting temperature higher than the melting temperature of the metallic material forming the article.

3. The metallic grain starter of claim 1 wherein the at least one geometric feature extending from the metallic grain starter that modifies the heat transfer characteristics includes an external fin attached to the grain starter.

4. The metallic grain starter of claim 1 wherein the at least one geometric feature that modifies the heat transfer characteristics is an external fin forming an integral part of the grain starter.

5. The metallic grain starter of claim 1 wherein the shape of the metallic grain starter is cross sectional in area at a grain starter/article interface that is greater than a cross sectional area opposite the grain starter/article interface, the metallic grain starter transitioning arcuately from the grain starter/article interface to the opposite cross sectional interface.

6. The metallic grain starter of claim 5 wherein the grain starter shape is trapezoidal.

7. The metallic grain starter of claim 1 wherein the preselected crystallographic direction is a <001> direction.

8. The metallic grain starter of claim 1 wherein the metallic grain starter includes a chill plate and is formed in-situ on the chill plate underneath a mold.

9. A structure comprising:
a metallic grain starter, wherein the grain starter comprises a grain-starting material;
an article attached to the grain starter, wherein the article is characterized by directionally solidified grains, the grains aligned in a preselected crystallographic direction, the article further characterized by a substantial freedom of stray grains oriented at angles to the preselected crystallographic direction; and
means for transferring heat away from the grain starter, wherein the means for transferring heat away from the grain starter modifies heat flow from the grain starter, the means for transferring heat away from the grain starter being solely a feature of the grain starter.

10. The structure of claim 9 wherein the means for transferring heat away from the grain starter includes an external fin.

11. The structure of claim of claim 10 wherein the external fin is attached to the metallic grain starter.

12. The structure of claim 10 wherein the external fin forms an integral part of the metallic grain starter.

13. The structure of claim 9 wherein the shape of the metallic grain starter is cross sectional in area at a grain starter/article interface that is greater than a cross sectional area opposite the grain starter/article interface, the grain starter transitioning arcuately from the grain starter/article interface to the opposite cross sectional interface.

14. The structure of claim 13 wherein the geometric shape of the metallic grain starter is trapezoidal.

15. The structure of claim 9 wherein the article is a turbine bucket, a nozzle or a shroud.

16. The structure of claim 9 wherein the preselected crystallographic direction is parallel to a direction of maximum stress in the article.

17. A method for forming an article having directionally solidified grains comprising the steps of:
providing a mold;
providing a metallic grain starter, the metallic grain starter including means for transferring heat away from the metallic grain starter;
attaching the metallic grain starter to the mold;
supplying molten metal to the mold;
providing a heat source to maintain the molten metal in the mold in a preselected temperature range;
slowly withdrawing the molten metal-containing mold from the heat source into a cold zone adjacent to the heat source while forming an advancing solidification front within the molten metal as heat is removed from the molten metal within the mold, while the grain starter initiates the formation of grains in a preselected crystallographic direction, wherein the means for transferring heat away from the grain starter alters a profile of the advancing solidification front within the mold;
continuing to slowly withdraw the molten metal-containing mold from the heat source as heat is withdrawn through the grain starter and the means for transferring heat away from the grain starter so that the formed grains advance into the molten metal in the preselected metallurgical direction with the substantial absence of a nucleation and growth of stray grains in the molten metal in front of the advancing solidification front; and
completing the solidification of molten metal in the mold.

18. The method of claim 17 further providing a chill plate and attaching the chill plate to a bottom of the metallic grain starter.

19. The method of claim 17 wherein the step of providing a mold includes providing an investment casting mold.

20. The method of claim 19 wherein the step of supplying molten metal includes supplying molten metal selected from the group consisting of a nickel-base superalloy, a cobalt-base superalloy, an iron-base superalloy and combinations thereof.

* * * * *